(12) United States Patent
Hiraki et al.

(10) Patent No.: US 11,417,783 B2
(45) Date of Patent: Aug. 16, 2022

(54) SEMICONDUCTOR LIGHT RECEIVER

(71) Applicant: Nippon Telegraph and Telephone Corporation, Tokyo (JP)

(72) Inventors: Tatsuro Hiraki, Tokyo (JP); Shinji Matsuo, Tokyo (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 17/263,853

(22) PCT Filed: Aug. 2, 2019

(86) PCT No.: PCT/JP2019/030476
§ 371 (c)(1),
(2) Date: Jan. 27, 2021

(87) PCT Pub. No.: WO2020/044952
PCT Pub. Date: Mar. 5, 2020

(65) Prior Publication Data
US 2021/0226073 A1    Jul. 22, 2021

(30) Foreign Application Priority Data
Aug. 28, 2018 (JP) .............................. JP2018-158941

(51) Int. Cl.
*H01L 31/0232* (2014.01)
*H01L 31/105* (2006.01)
*H01L 31/18* (2006.01)

(52) U.S. Cl.
CPC ........ *H01L 31/0232* (2013.01); *H01L 31/105* (2013.01); *H01L 31/18* (2013.01)

(58) Field of Classification Search
CPC ... H01L 31/0232–02327; H01L 31/105–1055; H01L 31/18; H01L 31/184
See application file for complete search history.

(56) References Cited

U.S. PATENT DOCUMENTS

| 10,546,963 B2 | 1/2020 | Hon et al. |
| 2014/0131827 A1 | 5/2014 | Yamaguchi et al. |
| 2018/0138350 A1 | 5/2018 | Nada et al. |

FOREIGN PATENT DOCUMENTS

| JP | 2013187252 A | 9/2013 |
| JP | 201456883 A | 3/2014 |

(Continued)

OTHER PUBLICATIONS

Matsuo et al. (Directly modulated buried heterostructure DFB laser on SiO2/Si substrate fabricated by regrowth of InP using bonded active layer, Optics Express, vol. 22, Issue 10, pp. 12139-12147 (2014)). (Year: 2014).*

(Continued)

*Primary Examiner* — Andres Munoz
(74) *Attorney, Agent, or Firm* — Slater Matsil, LLP (57) ABSTRACT

A semiconductor layer formed on a clad layer and a light absorbing layer formed on the semiconductor layer are provided. The semiconductor layer includes a p-type region and an n-type region. The p-type region, which is of p-type, is provided on a side of one side portion of the light absorbing layer in a direction perpendicular to a direction in which light is guided, and the n-type region, which is of n-type, is provided on a side of another side portion of the light absorbing layer in the direction perpendicular to the direction in which light is guided. A p-type contact layer, which is of p-type, is formed on the p-type region, and an n-type contact layer is formed on the n-type region.

15 Claims, 7 Drawing Sheets

(56) References Cited

FOREIGN PATENT DOCUMENTS

| JP | 201499467 A | | 5/2014 |
|---|---|---|---|
| JP | 2016111363 A | | 6/2016 |
| JP | 2016171173 A | | 9/2016 |
| JP | 2016219614 A | * | 12/2016 |
| JP | 2018129483 A | | 8/2018 |
| WO | 2016190346 | | 12/2016 |

OTHER PUBLICATIONS

S. Matsuo, et al., "Avalanche Gain in Membrane p-i-n Photodiodes on Si Substrate," Proc. of the 24th congress of the international commission for optics, Th1J-05, 2017, 2 pages.

* cited by examiner

SEMICONDUCTOR LIGHT RECEIVER

This patent application is a national phase filing under section 371 of PCT/JP2019/030476, filed Aug. 2, 2019, which claims the priority of Japanese patent application 2018-158941, filed Aug. 28, 2018, each of which is incorporated herein by reference in its entirety.

TECHNICAL FIELD

The present disclosure relates to a semiconductor modulator and a semiconductor photodetector that are integrated.

BACKGROUND

Figure 6A:
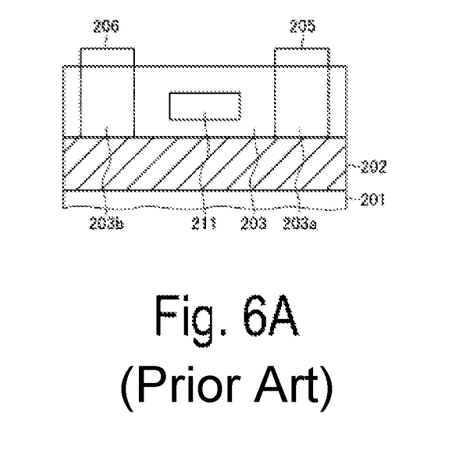
FIG. 6A is a cross-sectional view illustrating a configuration of a modulator.
Figure 6B:
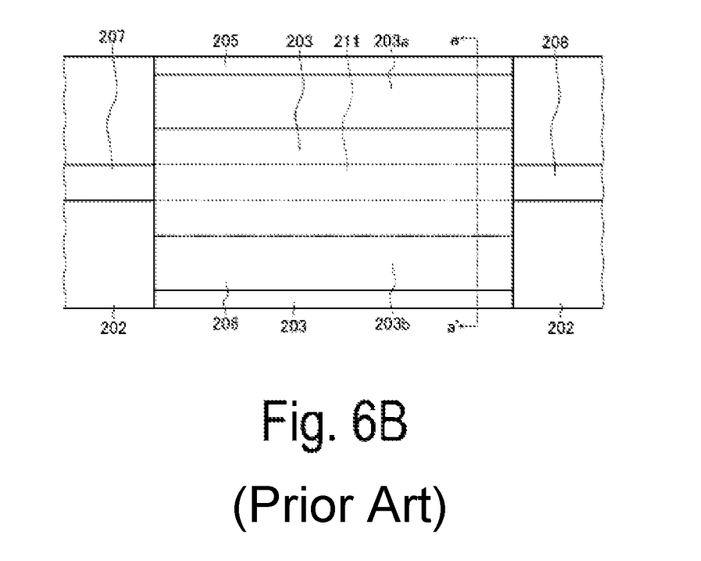
FIG. 6B is a plan view illustrating a configuration of a modulator.
Figure 6C:
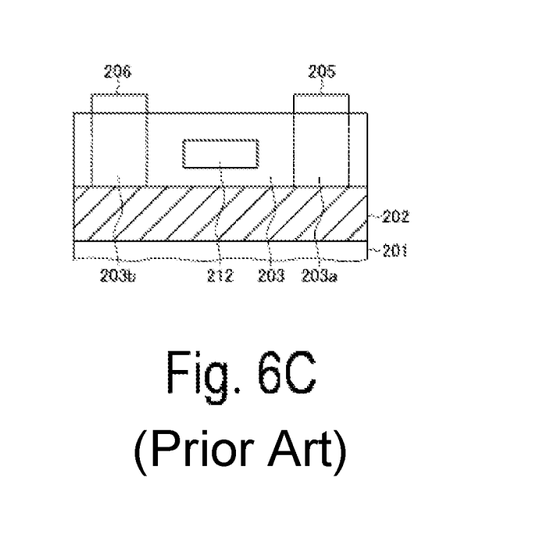
FIG. 6C is a cross-sectional view illustrating a configuration of a semiconductor photodetector.
Figure 6D:
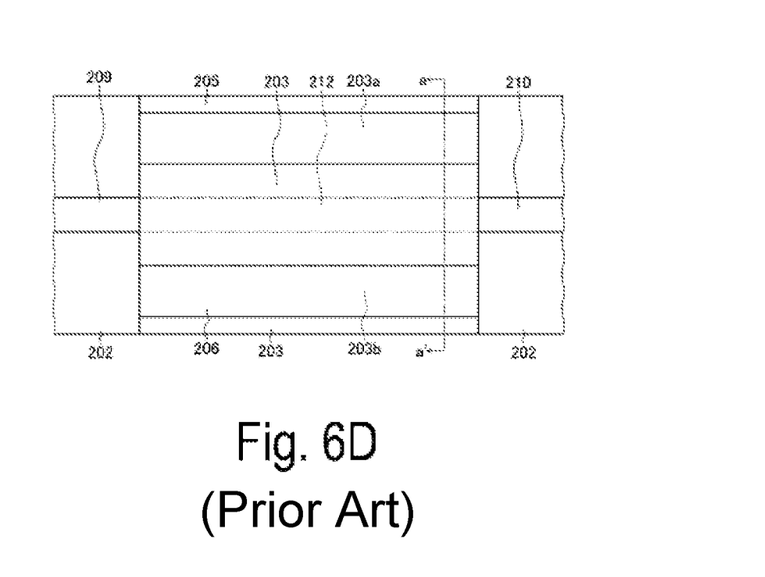
FIG. 6D is a plan view illustrating a configuration of a semiconductor photodetector.

Techniques for integrating a laser, a modulator, and a photodetector including a Group III-V semiconductor on a Si substrate have been widely examined. In particular, integration of a Mach-Zehnder modulator and a photodetector is an important technique in applications such as coherent communication. An integrated element using an InP-based material is a promising technique because of advantages such as the ease of integration with an optical waveguide and high modulation efficiency based on a strong light confinement coefficient. For example, a modulator as illustrated in FIGS. 6A and 6B and a photodetector as illustrated in FIGS. 6C and 6D have been reported (see Non Patent Literature 1). Note that FIG. 6A illustrates a cross-section taken along line a-a' in FIG. 6B. In addition, FIG. 6C illustrates a cross-section taken along line a-a' in FIG. 6D.

Each of the modulator and the photodetector is configured such that a semiconductor layer 203 formed of InP is disposed on a Si substrate 201 with an insulating layer 202 formed of $SiO_2$ therebetween, and a p-type region 203a formed of p-type InP and an n-type region 203b formed of n-type InP are formed with the semiconductor layer 203 interposed therebetween. In addition, a p-type contact layer 205 is formed on the p-type region 203a, and an n-type contact layer 206 is formed on the n-type region 203b. The p-type contact layer 205 and the n-type contact layer 206 are formed of, for example, InGaAs.

With the above-described configuration commonly used, the modulator includes a modulator core layer 211 embedded in the semiconductor layer 203 and formed of InGaAsP (FIGS. 6A and 6B), and the photodetector includes a light absorbing layer 212 embedded in the semiconductor layer 203 (FIGS. 6C and 6D). The light absorbing layer 212 has a multiple quantum well structure including a compound semiconductor having a bandgap different from that of the modulator core layer 211. Note that outer core layers 207 and 208 formed of InP are connected to the modulator core layer 211, and outer core layers 209 and 210 formed of InP are connected to the light absorbing layer 212.

CITATION LIST

Non Patent Literature

Non Patent Literature 1: S. Matsuo et al., "Avalanche Gain in Membrane p-i-n Photodiodes on Si Substrate", Proc. of the 24th congress of the international commission for optics, Th1J-05, 2017.

SUMMARY

Technical Problem

However, in the above-described technique, the modulator core layer and the light absorbing layer are formed of materials having different bandgaps, and thus an increase in the number of epitaxial growth processes is inevitable. In addition, a light confinement coefficient of the light absorbing layer is extremely high, and there is a problem in that an increase in incident light power decreases an operational band due to electric field shielding.

Embodiments of the present disclosure are contrived to solve the above-described problem, and an object thereof is to be able to prevent an increase of the number of processes and prevent a decrease of an operational band.

Means for Solving the Problem

A semiconductor photodetector according to embodiments of the present disclosure includes a clad layer, a semiconductor layer formed on the clad layer and including a compound semiconductor through which target light is guided, a light absorbing layer including a compound semiconductor formed on the semiconductor layer, a p-type region, which is of p-type, formed in the semiconductor layer on a side of one side portion of the light absorbing layer in a direction perpendicular to a direction in which light is guided, an n-type region, which is of n-type, formed in the semiconductor layer on a side of another side portion of the light absorbing layer in the direction perpendicular to the direction in which light is guided, and a p-type contact layer being of p-type and formed on the p-type region.

The semiconductor photodetector described above further includes a core layer provided to extend in a direction in which light is guided through the semiconductor layer and including a compound semiconductor having a refractive index higher than that of the semiconductor layer.

In the semiconductor photodetector described above, the light absorbing layer and the p-type contact layer include a compound semiconductor and are formed integrally.

The semiconductor photodetector further includes an n-type contact layer being of n-type and formed on the n-type region. Note that the light absorbing layer, the p-type contact layer, and the n-type contact layer may include a compound semiconductor and be formed integrally.

In the semiconductor photodetector described above, the semiconductor layer between the p-type region and the n-type region may be of n-type.

The semiconductor photodetector described above may further include a lower core layer provided to extend in a direction in which light is guided through the clad layer and including a semiconductor having a refractive index higher than that of the clad layer.

Effects of Embodiments of the Invention

As described above, according to embodiments of the present disclosure, a light absorbing layer including a compound semiconductor is provided on a semiconductor layer together with a contact layer, and the semiconductor layer is formed on a clad layer and includes a compound semiconductor through which target light is guided. Thus, an excellent effect of preventing an increase of the number of processes and preventing a decrease of an operational band is obtained.

DETAILED DESCRIPTION OF ILLUSTRATIVE EMBODIMENTS

Hereinafter, semiconductor photodetectors in embodiments of the present disclosure will be described.

First Embodiment

First, a semiconductor photodetector in a first embodiment of the present disclosure will be described with reference to FIGS. 1A and 1B. Note that FIG. 1A illustrates a cross-section taken along line a-a' in FIG. 1B.

First, the semiconductor photodetector includes a clad layer 102 formed on a Si substrate 101, a semiconductor layer 103 formed on the clad layer 102, and a light absorbing layer 104 formed on the semiconductor layer 103. The clad layer 102 is formed of, for example, $SiO_2$. The semiconductor layer 103 includes, for example, a compound semiconductor such as InP.

Figure 1A:
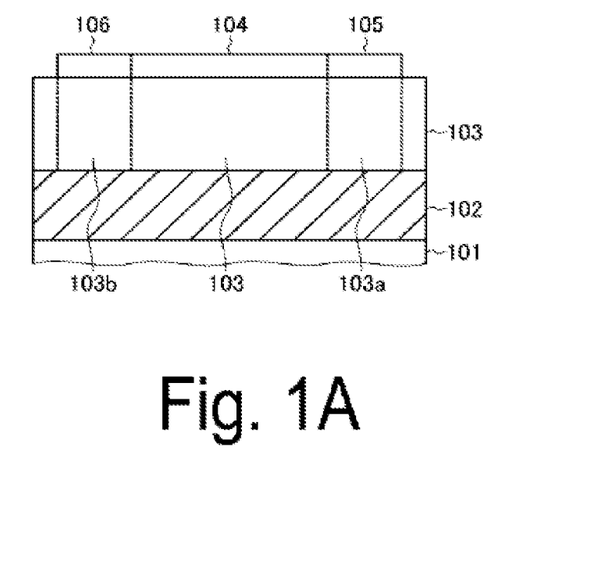
FIG. 1A is a cross-sectional view illustrating a configuration of a semiconductor photodetector in a first embodiment of the present disclosure.
Figure 1B:
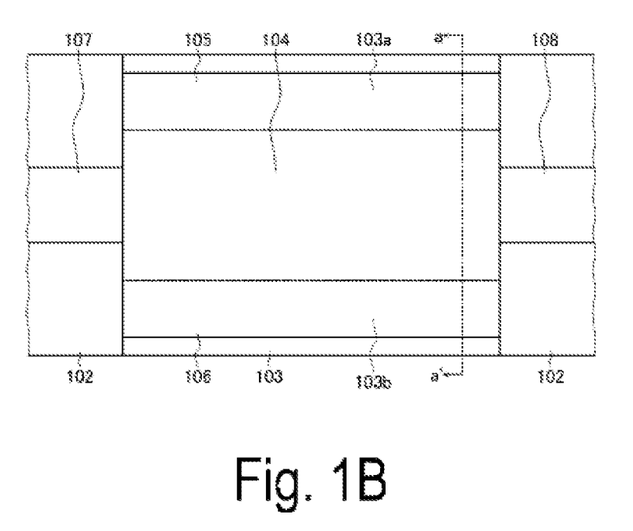
FIG. 1B is a plan view illustrating a configuration of the semiconductor photodetector in the first embodiment of the present disclosure.

Target light is guided in a direction from a front side to a back side of the paper in FIG. 1A and in a right-left direction of the paper in FIG. 1B in the semiconductor layer 103. The light absorbing layer 104 includes a compound semiconductor including, for example, undoped i-InGaAs.

For example, first, the clad layer 102 is formed on a main surface of the Si substrate 101 by a thermal oxidation method, a CVD method, or the like. On the other hand, an InP layer epitaxially grown on a growth substrate may be bonded to the clad layer 102, and then the growth substrate may be removed, thereby forming the semiconductor layer 103 from the bonded InP layer. Furthermore, the light absorbing layer 104 can be formed by growing InGaAs on the semiconductor layer 103 formed on the clad layer 102 by an organic metal vapor phase growth method, a molecular beam epitaxy method, or the like. In addition, the InGaAs layer and the InP layer may be sequentially epitaxially grown on the growth substrate, the InP layer may be bonded to the clad layer 102, and then the growth substrate may be removed. Thereby, the InGaAs layer serving as the semiconductor layer 103 and the light absorbing layer 104 is formed on the clad layer 102.

Here, the semiconductor layer 103 includes a p-type region 103a, which is a p-type, on a side of one side portion of the light absorbing layer 104 in a direction perpendicular to a direction in which light is guided. In addition, the semiconductor layer 103 includes an n-type region 103b, which is an n-type, on a side of the other side portion of the light absorbing layer 104 in a direction perpendicular to a direction in which light is guided. Note that the semiconductor layer 103 between the p-type region 103a and the n-type region 103b may be of n-type. Note that an outer core layer 107 and an outer core layer 108 formed of, for example, InP are connected to the semiconductor layer 103. The outer core layer 107 and the outer core layer 108 are formed on the clad layer 102. For example, target light is input from an optical waveguide formed by the outer core layer 107 and target light is output to the optical waveguide formed by the outer core layer 107.

In addition, a p-type contact layer 105 which is of p-type is formed on the p-type region 103a. Additionally, in the first embodiment, an n-type contact layer 106 is formed on the n-type region 103b. In embodiments of the present disclosure, there is a large advantage in that the light absorbing layer 104 is disposed, together with a contact layer, on the semiconductor layer 103.

For example, as described above, the p-type region 103a, the n-type region 103b, the p-type contact layer 105, and the n-type contact layer 106 may be formed by forming the semiconductor layer 103, growing the InGaAs layer thereon, and then introducing predetermined impurities into each of the p-type region and the n-type region. In addition, the p-type region 103a and the n-type region 103b may be formed in advance before the semiconductor layer 103 is bonded to the clad layer 102 by bonding. Although not illustrated in the drawings, an electrode is formed on each of the p-type contact layer 105 and the n-type contact layer 106.

The p-type contact layer 105 and the n-type contact layer 106 are formed of, for example, InGaAs. Additionally, in the first embodiment, the light absorbing layer 104, the p-type contact layer 105, and the n-type contact layer 106 are integrally formed. In addition, the light absorbing layer 104, the p-type contact layer 105, and the n-type contact layer 106 include the same compound semiconductor.

In the first embodiment, a p-i-n diode is formed in a horizontal direction with respect to the plane of the Si substrate 101 to form a photodiode by the light absorbing layer 104, the p-type contact layer 105, and the n-type contact layer 106 which are formed in the same semiconductor layer formed on the semiconductor layer 103, thereby forming a waveguide coupled semiconductor photodetector. In the first embodiment, the light absorbing layer 104 is disposed in a layer that has been used as a contact layer in the related art. For this reason, the light absorbing layer 104 can be formed in a step (process) of forming the contact layer. Thus, the semiconductor photodetector and a modulator formed in another region not illustrated in the drawing can be integrated without increasing the number of steps.

In addition, according to the first embodiment, light confinement in the light absorbing layer 104 is relatively reduced as compared to an embedded core structure of the related art, and thus higher optical power resistance than that in the related art is obtained.

Second Embodiment

Figure 2:
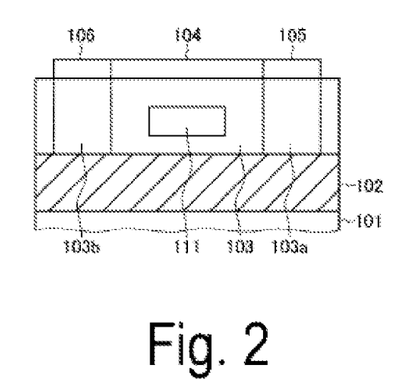
FIG. 2 is a cross-sectional view illustrating a configuration of a semiconductor photodetector in a second embodiment of the present disclosure.

Next, a semiconductor photodetector in a second embodiment of the present disclosure will be described below with reference to FIG. 2.

First, the semiconductor photodetector includes a clad layer 102 formed on a Si substrate 101, a semiconductor layer 103 formed on the clad layer 102, and a light absorbing layer 104 formed on the semiconductor layer 103. Target light is guided in a direction from a front side to a back side of the paper in FIG. 2 in the semiconductor layer 103. In addition, a p-type contact layer 105, which is of p-type, is formed on a p-type region 103a, and an n-type contact layer 106 is formed on an n-type region 103b. Note that the semiconductor layer 103 between the p-type region 103a and the n-type region 103b may be of n-type. These configurations are the same as those in the first embodiment described above.

In the second embodiment, a core layer 111 formed to be embedded in the semiconductor layer 103 is provided. The core layer 111 is provided to extend in a direction in which light is guided. In addition, the core layer 111 includes a compound semiconductor having a higher refractive index than that of the semiconductor layer 103 such as InGaAsP. For example, the core layer 111 may be formed in advance in the semiconductor layer 103 which is formed to be bonded to the clad layer 102.

In the second embodiment, the core layer 111, which is used as a configuration of a modulator in another region not illustrated in the drawing, is used as a waveguide core of a semiconductor photodetector formed by the light absorbing layer 104. Target light is guided through an optical waveguide formed by the core layer 111, and is gradually absorbed by the light absorbing layer 104 in a process of being guided through the optical waveguide. For example, the core layer 111 having a thickness of 100 nm may be formed to be embedded in the semiconductor layer 103 having a thickness of 200 nm. In addition, the light absorbing layer 104 (the p-type contact layer 105 and the n-type contact layer 106) having a thickness of 50 nm may be formed on the semiconductor layer 103.

The semiconductor photodetector formed by the light absorbing layer 104 according to the second embodiment with such a configuration absorbs light in the 1.5 μm band and performs photoelectric conversion. The majority of the intensity of guided light is confined in the core layer 111, and thus it is effective in reducing light confinement in the light absorbing layer 104. In addition, it is possible to prevent light from leaking to the p-type region 103a, the n-type region 103b, the p-type contact layer 105, and the n-type contact layer 106 in the vicinity of the core layer 111 by strongly confining light in the core layer 111, thus reducing light loss due to free carrier absorption compared to the first embodiment.

Third Embodiment

Figure 3A:
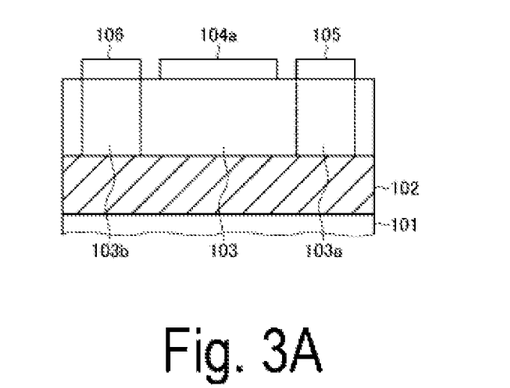
FIG. 3A is a cross-sectional view illustrating a configuration of a semiconductor photodetector in a third embodiment of the present disclosure.
Figure 3B:
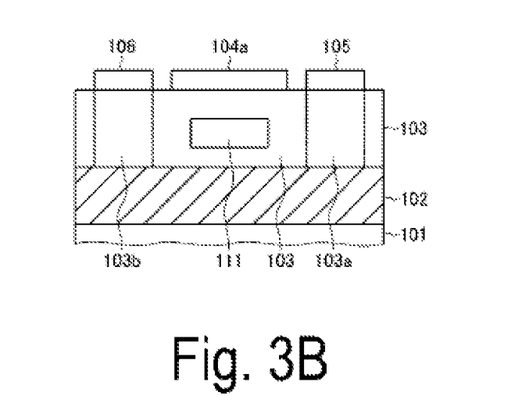
FIG. 3B is a cross-sectional view illustrating a configuration of another semiconductor photodetector in the third embodiment of the present disclosure.

Next, a semiconductor photodetector in a third embodiment of the present disclosure will be described with reference to FIGS. 3A and 3B.

First, the semiconductor photodetector includes a clad layer 102 formed on a Si substrate 101, a semiconductor layer 103 formed on the clad layer 102, and a light absorbing layer 104a formed on the semiconductor layer 103. Target light is guided in a direction from a front side to a back side of the paper in FIGS. 3A and 3B in the semiconductor layer 103. In addition, a p-type contact layer 105, which is of p-type, is formed on a p-type region 103a, and an n-type contact layer 106 is formed on an n-type region 103b. These configurations are the same as those in the first and second embodiments described above except for the light absorbing layer 104a.

In the third embodiment, the light absorbing layer 104a, the p-type contact layer 105, and the n-type contact layer 106 are separately formed as separate bodies on the semiconductor layer 103. Note that, as illustrated in FIG. 3A, the semiconductor layer 103 may be configured in the same manner as in the first embodiment, and as illustrated in FIG. 3B, the semiconductor layer 103 may be provided with a core layer 111 embedded in the semiconductor layer 103 as in the second embodiment.

Fourth Embodiment

Figure 4A:
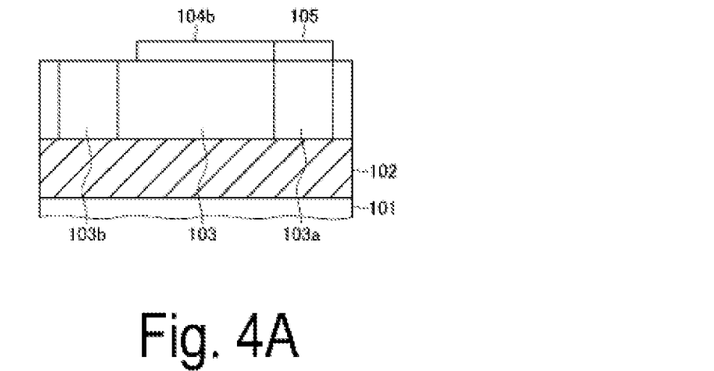
FIG. 4A is a cross-sectional view illustrating a configuration of a semiconductor photodetector in a fourth embodiment of the present disclosure.
Figure 4B:
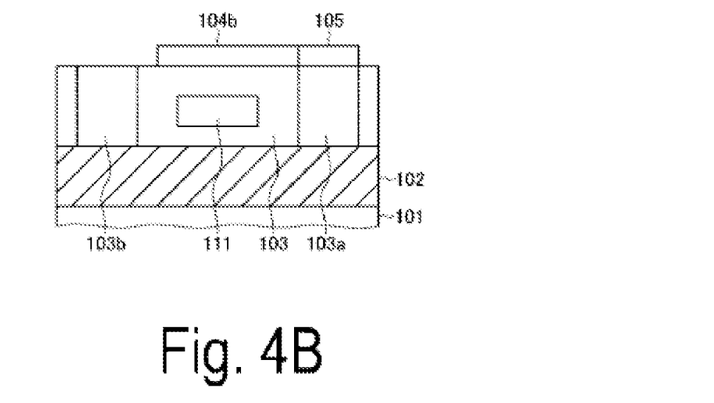
FIG. 4B is a cross-sectional view illustrating a configuration of another semiconductor photodetector in the fourth embodiment of the present disclosure.

Next, a semiconductor photodetector in a fourth embodiment of the present disclosure will be described with reference to FIGS. 4A and 4B.

First, the semiconductor photodetector includes a clad layer 102 formed on a Si substrate 101, a semiconductor layer 103 formed on the clad layer 102, and a light absorbing layer 104b formed on the semiconductor layer 103. Target light is guided in a direction from a front side to a back side of the paper in FIGS. 4A and 4B in the semiconductor layer 103. In addition, a p-type contact layer 105, which is of p-type, is formed on a p-type region 103a. These configurations are the same as those in the first, second, and third embodiments described above except for the light absorbing layer 104b. In the fourth embodiment, an n-type contact layer 106 is not provided. In the fourth embodiment, an electrode not illustrated in the drawing is formed directly on an n-type region 103b.

Fifth Embodiment

Figure 5A:
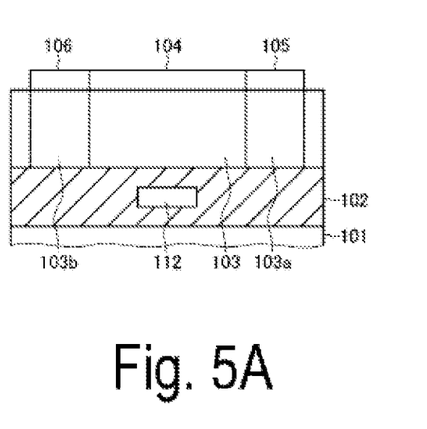
FIG. 5A is a cross-sectional view illustrating a configuration of a semiconductor photodetector in a fifth embodiment of the present disclosure.
Figure 5B:
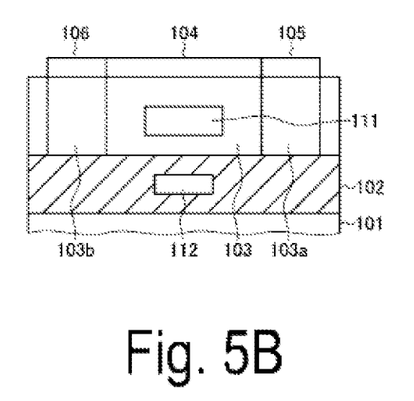
FIG. 5B is a cross-sectional view illustrating a configuration of another semiconductor photodetector in the fifth embodiment of the present disclosure.

Next, a semiconductor photodetector in a fifth embodiment of the present disclosure will be described with reference to FIGS. 5A and 5B.

First, the semiconductor photodetector includes a clad layer 102 formed on a Si substrate 101, a semiconductor layer 103 formed on the clad layer 102, and a light absorbing layer 104 formed on the semiconductor layer 103. Target light is guided in a direction from a front side to a back side of the paper in FIGS. 5A and 5B in the semiconductor layer 103. In addition, a p-type contact layer 105, which is of p-type, is formed on a p-type region 103a, and an n-type contact layer 106 is formed on an n-type region 103b. These configurations are the same as those in the first, second, and third embodiments described above.

In the fifth embodiment, a lower core layer 112 provided to extend in a direction in which light is guided into the clad layer 102 and including a semiconductor having a higher refractive index than that of the clad layer 102 is included. The lower core layer 112 may be formed of, for example, Si. In the fifth embodiment, an optical waveguide formed by the lower core layer 112 is provided below the semiconductor layer 103 (on a side of the Si substrate 101). According to the fifth embodiment, light is also confined in an optical waveguide formed by the lower core layer 112, and thus a light confinement coefficient for the light absorbing layer 104 can be adjusted in accordance with the shape (a cross-sectional shape, a shape in a planar view) and the arrangement of the lower core layer 112.

As described above, according to embodiments of the present disclosure, a light absorbing layer including a compound semiconductor is provided, together with a contact layer, on a semiconductor layer, and the semiconductor layer is formed on a clad layer and includes a compound semiconductor through which target light is guided. Thus, it is possible to prevent an increase of the number of processes and prevent a decrease of an operational band.

Note that the present disclosure is not limited to the embodiments described above, and it is apparent that many modifications and combinations can be made by those skilled in the art within the technical idea of the present disclosure.

The invention claimed is:

1. A semiconductor photodetector comprising:
a clad layer;
a semiconductor layer on the clad layer and comprising a first compound semiconductor through which target light is guided;
a light absorbing layer comprising a second compound semiconductor on the semiconductor layer;
a p-type region in the semiconductor layer on a side of a first side portion of the light absorbing layer in a direction perpendicular to a direction in which the target light is guided;
an n-type region in the semiconductor layer on a side of a second side portion of the light absorbing layer in the direction perpendicular to the direction in which the target light is guided; and
a p-type contact layer on the p-type region.

2. The semiconductor photodetector according to claim 1, further comprising a core layer extending in the direction in which the target light is guided through the semiconductor layer and comprising a third compound semiconductor having a refractive index higher than that of the semiconductor layer.

3. The semiconductor photodetector according to claim 1, wherein the light absorbing layer and the p-type contact layer comprise a third compound semiconductor and are formed integrally.

4. The semiconductor photodetector according to claim 1, further comprising an n-type contact layer on the n-type region.

5. The semiconductor photodetector according to claim 4, wherein the light absorbing layer, the p-type contact layer, and the n-type contact layer comprise the second compound semiconductor and are formed integrally.

6. The semiconductor photodetector according to claim 1, wherein the semiconductor layer between the p-type region and the n-type region is of n-type.

7. The semiconductor photodetector according to claim 1, further comprising a lower core layer extending in a direction in which the target light is guided through the clad layer and comprising a semiconductor having a refractive index higher than that of the clad layer.

8. A method of forming a semiconductor photodetector, the method comprising:
providing a clad layer;
forming a semiconductor layer on the clad layer, wherein the semiconductor layer comprises a first compound semiconductor through which target light is guided;
forming a light absorbing layer on the semiconductor layer, wherein the light absorbing layer comprises a second compound semiconductor;
forming a p-type region in the semiconductor layer on a side of a first side portion of the light absorbing layer in a direction perpendicular to a direction in which the target light is guided;
forming an n-type region in the semiconductor layer on a side of a second side portion of the light absorbing layer in the direction perpendicular to the direction in which the target light is guided; and
forming a p-type contact layer on the p-type region.

9. The method according to claim 8, further comprising forming a core layer extending in the direction in which the target light is guided through the semiconductor layer, wherein the core layer comprises a third compound semiconductor having a refractive index higher than that of the semiconductor layer.

10. The method according to claim 8, wherein the light absorbing layer and the p-type contact layer comprise a third compound semiconductor and are formed integrally.

11. The method according to claim 8, further comprising forming an n-type contact layer on the n-type region.

12. The method according to claim 11, wherein the light absorbing layer, the p-type contact layer, and the n-type contact layer comprise the second compound semiconductor and are formed integrally.

13. The method according to claim 8, wherein the semiconductor layer between the p-type region and the n-type region is of n-type.

14. The method according to claim 8, further comprising forming a lower core layer extending in a direction in which the target light is guided through the clad layer.

15. The method according to claim 14, wherein the lower core layer comprises a semiconductor having a refractive index higher than that of the clad layer.

* * * * *